(12) United States Patent
Haslbeck et al.

(10) Patent No.: US 10,978,628 B2
(45) Date of Patent: Apr. 13, 2021

(54) DEVICE AND CONNECTION CARRIER

(71) Applicant: OSRAM Opto Semiconductors GmbH, Regensburg (DE)

(72) Inventors: Stephan Haslbeck, Regensburg (DE); Dirk Becker, Langquaid (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/475,064

(22) PCT Filed: Dec. 29, 2017

(86) PCT No.: PCT/EP2017/084822
§ 371 (c)(1),
(2) Date: Jun. 28, 2019

(87) PCT Pub. No.: WO2018/122381
PCT Pub. Date: Jul. 5, 2018

(65) Prior Publication Data
US 2019/0326496 A1     Oct. 24, 2019

(30) Foreign Application Priority Data
Dec. 30, 2016   (DE) .................. 10 2016 125 909

(51) Int. Cl.
*H01L 33/62* (2010.01)
*H01L 25/16* (2006.01)
*H01L 31/0203* (2014.01)
*H01L 33/48* (2010.01)

(52) U.S. Cl.
CPC ............ *H01L 33/62* (2013.01); *H01L 25/167* (2013.01); *H01L 31/0203* (2013.01); *H01L 33/483* (2013.01)

(58) Field of Classification Search
CPC ....................................... H01L 33/62
See application file for complete search history.

(56) References Cited

U.S. PATENT DOCUMENTS

| 8,202,745 B2 | 6/2012 | Andrews |
| 9,419,190 B2 | 8/2016 | Barth et al. |
| 9,608,172 B2 | 3/2017 | Schwarz et al. |
| 2004/0208210 A1 | 10/2004 | Inoguchi |

(Continued)

FOREIGN PATENT DOCUMENTS

| DE | 102006048592 A1 | 4/2008 |
| DE | 112005003652 T5 | 6/2008 |

(Continued)

*Primary Examiner* — William A Harriston
(74) *Attorney, Agent, or Firm* — Slater Matsil, LLP

(57) ABSTRACT

A device and a connection carrier are disclosed. In an embodiment a device includes a connection carrier, a frame and an encapsulation body, wherein the connection carrier, the encapsulation body and/or the frame have different thermal expansion coefficients, a semiconductor chip mechanically and electronically connected to the connection carrier and a metal layer arranged between the connection carrier and the frame, wherein the encapsulation body surrounds the semiconductor chip and is adjacent to the connection carrier and the frame, wherein the metal layer is not in electrically conductive connection, and wherein the metal layer projects beyond the frame in a lateral direction.

20 Claims, 4 Drawing Sheets

(56) References Cited

U.S. PATENT DOCUMENTS

| | | | |
|---|---|---|---|
| 2004/0227149 A1 | 11/2004 | Ibbetson et al. | |
| 2007/0170454 A1* | 7/2007 | Andrews ................. | H01L 33/52 257/100 |
| 2008/0023711 A1 | 1/2008 | Tarsa et al. | |
| 2014/0183591 A1 | 7/2014 | Jow et al. | |

FOREIGN PATENT DOCUMENTS

| | | |
|---|---|---|
| DE | 102012110774 A1 | 5/2014 |
| WO | 2011026768 A1 | 3/2011 |

* cited by examiner

DEVICE AND CONNECTION CARRIER

This patent application is a national phase filing under section 371 of PCT/EP2017/084822, filed Dec. 29, 2017, which claims the priority of German patent application 102016125909.8, filed Dec. 30, 2016, each of which is incorporated herein by reference in its entirety.

TECHNICAL FIELD

A device and a connection carrier are specified.

BACKGROUND

The international application publication WO 2011/026786 A1 discloses a device.

SUMMARY OF THE INVENTION

Embodiments provide a device with an improved mechanical stability. Further embodiments provide a device with improved optical properties. And yet other embodiments provide a connection carrier for such a device.

According to at least one embodiment of the device, the device comprises a connection carrier. The connection carrier is a component of the device, enabling the electrical connection of another component of the device. Furthermore, the connection carrier is a mechanically supporting component of the device, mechanically supporting and carrying other components, in particular all other components of the device. The connection carrier comprises, for example, a base body that is formed by an electrically isolating material. Contacts and/or circuit paths are arranged on and/or introduced in the base body, enabling electrical contacting of further components of the device. The connection carrier can, for example, be a printed circuit board or a ceramic carrier with contacts.

According to at least one embodiment of the device, the device comprises a frame. The frame is a component of the device, surrounding a region on the connection carrier in portions or completely. The frame projects beyond the connection carrier at an upper side along a vertical direction. The vertical direction is a direction that runs transversely or perpendicularly with respect to lateral directions. The lateral directions run in parallel to the main plane of extension of the connection carrier. The frame is, for example, designed in the manner of a wall or a border surrounding a portion on the upper side of the connection carrier completely in the lateral directions.

According to at least one embodiment of the device, the device comprises an encapsulation body. The encapsulation body is, for example, a body being designed in an electrically isolating manner and enclosing at least one component of the device at least in portions or completely. For this purpose, the encapsulation body can be formed by a plastic material applied on the connection carrier at the upper side, for example, by casting, extruding or molding. For example, the frame together with the connection carrier limits a cavity on the upper side of the connection carrier that is completely surrounded by the frame in lateral directions. This cavity can then at least partly be filled with the encapsulation body.

According to at least one embodiment of the device, the encapsulation body, the connection carrier and/or the frame have different thermal expansion coefficients. This can, for example, be achieved by the base material by which the base body of the connection carrier is formed being different from the base material by which the frame and/or the encapsulation body is formed. The base material is in this case and in the following the material of which a component of the device consists for the most part. For example, the component of the device consists of the base material by at least 80 wt %, in particular by at least 90 wt % or completely.

For example, the connection carrier can be a FR4 circuit board the base body of which is formed by a plastic material such as an epoxy material filled with glass fibers. The frame can in that case, for example, be formed by another plastic material, such as a liquid-crystalline polymer (LCP), or polyphthalamide (PPA). The encapsulation body can in turn be formed by an epoxy material and/or a silicone. The difference of the thermal expansion coefficient between the connection carrier and the frame in a lateral spatial direction is, for example, at least 1%, in particular at least 25%, or at least 50%. The difference of the thermal expansion coefficient between the connection carrier and the encapsulation body in a lateral spatial direction is, for example, at least 1%, in particular at least 25%, or at least 50%. The difference of the thermal expansion coefficient between the frame and the encapsulation body in a lateral spatial direction is, for example, at least 1%, in particular at least 25%, or at least 50%. The thermal expansion coefficient of epoxy resin is, for example, 185 ppm, the thermal expansion coefficient of PPA is, for example, 100 ppm, and the thermal expansion coefficient of LCP is 40-60 ppm.

It is possible that the encapsulation body also has a thermal expansion coefficient that is different from the thermal expansion coefficient of the connection carrier and from the thermal expansion coefficient of the frame. In particular, at least two of the following components have thermal expansion coefficients that are different from each other in at least a spatial direction: connection carrier, frame, encapsulation body. The difference of the thermal expansion coefficient in a lateral spatial direction is in that case, for example, at least 1%, in particular at least 5%, or at least 10%.

According to at least one embodiment of the device, the device comprises a semiconductor chip that is mechanically and electrically connected to the connection carrier. For example, the semiconductor chip can be in electrically conductive connection with contacts of the connection carrier, such that the semiconductor chip can be provided with a current via the connection carrier, thus being operable via the connection carrier. The semiconductor chip can, for example, be an electronic and/or optoelectronic device. The semiconductor chip can, for example, be a diode, an integrated circuit, a transistor, a light-emitting diode, or a laser diode. The semiconductor chip is, for example, mechanically and/or electrically connected with the connection carrier by means of a brazing material, or an adhesive.

According to at least one embodiment of the device, the device comprises a metal layer arranged between the connection carrier and the frame. The metal layer has, at least in a lateral spatial direction, a great extension in relation to a thickness of the metal layer in the vertical direction. The extension in the lateral direction is, for example, at least 10 times, in particular at least 100 times greater than the extension in the vertical direction. The metal layer is preferably formed by a metal having a high ductility. The metal layer can, for example, contain one of the following metals, or consist of one of the following metals: chrome, nickel, copper, gold, palladium. Here, it is in particular possible that the metal layer consists of the same metal, or the same metal combination as the contact and/or the circuit path of the connection carrier.

According to at least one embodiment of the device, the encapsulation body surrounds the semiconductor chip and is adjacent to the connection carrier and the frame. In other words, the encapsulation body is arranged in such a way that the semiconductor chip is adjacent to the encapsulation body at its outer surface that is not covered by the connection carrier, for example, at its upper side, and its side surfaces. The semiconductor chip can in particular be directly adjacent to the encapsulation body. In that way, the encapsulation body constitutes a mechanical and chemical protection for the semiconductor chip. If the semiconductor chip is an optoelectronic device, the encapsulation body can comprise further materials, such as luminescence conversion materials and/or radiation scattering materials and/or a filter material.

According to at least one embodiment of the device, the metal layer is not in electrically conductive connection. This means that the metal layer is not a contact or a circuit path of the connection carrier, the metal layer does in fact not have any electrical function within the device. In particular, the metal layer is not connected to any electrical or electronic component of the device and/or electrically isolated by the electrical or electronic components of the device. This can, for example, be achieved by the metal layer being completely surrounded by electrically isolating materials of the device, such as plastic materials.

The metal layer is, for example, at least in some portions arranged between the connection carrier and the frame. This means that the metal layer is, at least in certain, previously chosen regions, arranged between the frame and the connection carrier. The metal layer can be in direct contact with at least one of the two components. The metal layer is, for example, in direct contact with the base body of the connection carrier. Further components of the device can be arranged between the metal layer and the frame, such as, for example, an electrically isolating layer and/or an adhesive designed for mechanical attachment of the frame on the connection carrier.

According to at least one embodiment, a device is specified, with—a connection carrier, a frame and an encapsulation body, wherein the connection carrier, the encapsulation body and/or the frame have different thermal expansion coefficients,—a semiconductor chip that is mechanically and electrically connected to the connection carrier, and—a metal layer arranged between the connection carrier and the frame, wherein—the encapsulation body surrounds the semiconductor chip and is adjacent to the connection carrier and the frame, and—the metal layer is not in electrically conductive connection.

The device disclosed herein is amongst others based on the following considerations. A device can be a material composite consisting of different materials. In particular, the connection carrier, the frame, the encapsulation body, and composite materials such as adhesives and/or brazing materials can be formed by different materials with different thermal expansion coefficients. If such a material composite is exposed to thermal stress, in particular thermal cycle stress that can occur during unbrazing and/or under operation of the device, mechanical strain can occur at the interfaces of the different materials. Tis can result in said components of the device delaminating from each other. If this, for example, results in the encapsulation body separating from the frame, this can lead to the mechanical strain being so high that the delamination continues on into the connection carrier, and in that way a crack can occur in the connection carrier, for example, in the base body of the connection carrier.

To protect the surface of the connection carrier it is, for example, possible to use epoxy-based varnish for coating. Dependent on the current mechanical strain, in this way an improved mechanical stability can be ensured, and a crack can be prevented. However, it has been found that the mechanical strain can be so high that such a coating cracks as well, and damage to the connection carrier can occur.

Another possibility for preventing a damage of the connection carrier is to use thick adhesive layers between the different components, for example, between the connection carrier and the frame. For this purpose, such an adhesive should have a high mechanical flexibility in order to compensate for the mechanical strain between the components. This however has the disadvantage that the adhesive must be applied very thickly, and that a defined adhesive structure therefore is no longer possible and/or a thick adhesive layer is not compatible with further design specifications with regards to the device.

The device disclosed here is amongst others based on the finding that the introduction of the metal layer between the connection carrier and the frame can absorb the occurring mechanical strains particularly well. In that way, the connection carrier is protected against damages. In this regard, it has been found that even very thin metal layers are suitable can give the connection carrier sufficient protection. This has the advantage that the total thickness of the device in the vertical direction is only insignificantly increased by the metal layer and that the change of the thickness therefore cannot be optically observed by the end user of the device.

The device can, for example, be an optical sensor comprising at least two semiconductor chips. One of the semiconductor chips can be designed as a sender emitting electromagnetic radiation. The electromagnetic radiation can, for example, be infrared light or colored light, such as red light, or green light.

Another one of the semiconductor chips can be designed as a receiver designed to detect a reflected part of the electromagnetic radiation. The receiver can, for example, be a photo diode.

In such devices, optical cross talking between the semiconductor chips might occur. The frame is, for example, attached to the connection carrier by means of an adhesive. Because of unwanted reflections at cover glasses or because of insufficient radiation impermeability of the frame or the adhesive, electromagnetic radiation from the sender might reach the receiver. If this is the case, the receiver detects a signal that should not exist because of the actual use of the sensor. During the evaluation of the signal, it will then be superimposed by a high background noise, which negatively affects the accuracy of the evaluation. It has been found that in particular optical cross talking through the adhesive is a particularly severe source of interference.

If the use of the device requires a high accuracy of the signal detection, the crosstalking, in particular through the adhesive, is to be seen as critical. One possibility to reduce the cross talking would be to extend the light path through the adhesive. This can, for example, be achieved by the adhesive being applied in a minimum width. This however increases the surface necessary for the adhesive and thus the device.

Another possibility would be to sink the frame into the connection carrier base body, such that the adhesive lies within the connection carrier base body, making it impossible for electromagnetic radiation to launch into the adhesive. However, this makes the production of the device more difficult.

Another variant is to use a dyed, for example black, adhesive. However, measuring results have shown that such a blackening of the adhesive is not sufficient to reduce the background noise in the desired way.

The device disclosed herein makes now use of the idea that the metal layer arranged between the connection carrier and the frame prevents electromagnetic radiation from intruding into the adhesive and thus prevents crosstalking. Alternatively to the metal layer or in addition to the metal layer, a covering layer can be used being, for example, designed as a brazing varnish layer.

According to at least one embodiment of the device, the metal layer projects beyond the frame in a lateral direction. The metal layer can then in particular in some places be covered by the encapsulation body. This means that the metal layer, for example, can project into the portion that is bordered by the frame being at least in parts filled with the encapsulation body. In this way, the metal layer is in some portions covered by the encapsulation body and in some portions by the frame. In that way, it is in particular possible that the metal layer also compensates for a mechanical strain transferred to the connection carrier and/or the frame by the encapsulation body, thus further improving the protection of the connection carrier against damages. It is possible that the metal layer is in direct contact with the encapsulation body or that at least one more electrically isolating layer is arranged between the metal layer and the encapsulation body.

According to at least one embodiment of the device, the metal layer has at least two laterally separated regions. The metal layer can, for example, be designed as two stripes separated from each other, extending between the frame and the connection carrier at least in some places. In that way, it is for example, possible that an electrically isolating layer and/or an adhesive are directly adjacent to the frame and the connection carrier in some places. In that case, the frame adheres particularly well to the connection carrier. Furthermore, this embodiment is particularly advantageous if the frame part of the frame under which the metal layer is placed, separates two portions on the connection carrier from each other, wherein respectively at least one semiconductor chip is arranged in both portions of the connection carrier. The metal layer with the two laterally separated regions then ensures that the metal layer does not cause an electrically conductive connection between the two portions. Thus, in particular the ESD hardness of the device increases, because in this way, strain tops and/or electric charging cannot jump over the metal layer from one connection carrier portion to another connection carrier portion.

According to at least one embodiment of the device, a course of the metal layer in a plane parallel to the main plane of extension of the connection carrier follows a course of the frame in a plane parallel to the main plane of extension of the connection carrier in some portions or completely. This means that the metal layer can be placed along the whole frame between the frame and the connection carrier, such that the metal layer in its course follows the course of the frame completely. Alternatively, it is possible that the metal layer only is arranged between adjacent portions of the connection carrier being separated from each other by a frame part of the frame. In portions like this that are separated from each other by the frame part, the mechanical strain can be particularly high because of the fact, that the encapsulation body, for example, from two lateral sides, is working against the frame and the connection carrier under thermal pressure. The protection by the metal layer is therefore particularly effective in this region.

According to at least one embodiment, the metal layer is covered by an electrically isolating covering layer at its exposed outer surface. The electrically isolating covering layer can, for example, be a varnish layer, for example, epoxy-based. The varnish layer is, for example, a brazing varnish layer, for example, designed in white color at its upper side facing away from the connection carrier, to increase the reflection. Such an electrically isolating covering layer secures on one hand that the metal layer is isolated from other electrical and/or electronic components of the device. On the other hand, the isolating covering layer can constitute an additional mechanical protection of the connection carrier against damages. If the device is an optoelectronic device, the covering layer can also carry out optical tasks such as reflecting or absorbing electromagnetic radiation.

According to at least one embodiment of the device, the covering layer covers a base body and contacts of the connection carrier in some places. This means that the covering layer in this case not only is provided to isolate the metal layer electrically in relation to other components of the device, but the covering layer can cover the surface of the connection carrier that is not covered by the frame substantially, for example, by at least 60%, in particular by at least 75%. The covering layer can in that case, for example, be a braze stop varnish layer covering the base body and contacts of the connection carrier in some places.

According to at least one embodiment of the device, the metal layer has a thickness between at least 8 μm and at most 50 μm, measured in the vertical direction. Here, a thickness of at least 12 μm, typically of 30 μm, has proven to be particularly advantageous for the mechanical protection of the connection carrier against damages. By using a metal instead of an electrically isolating material, these small layer thicknesses are already sufficient to give sufficient protection against mechanical damage.

According to at least one embodiment, the device comprises at least two portions, wherein the portions respectively are separated from each other by a frame part of the frame, and each portion comprises at least one semiconductor chip. In other words, the connection carrier is divided into two or several portions that are respectively separated from each other by a frame part of the frame. For example, each portion can be completely surrounded by the frame, wherein a frame part of the frame separates adjacent portions from each other.

By this, the portions can have cavities that are separated from each other by the frame, wherein each cavity accommodates at least one semiconductor chip. The semiconductor chips in the cavities can then respectively be surrounded by an encapsulation material being adjacent, in the portions, to the connection carrier and the limiting frame. The metal layer disclosed herein is then arranged at least between every frame part and the connection carrier.

In this way, the device can, for example, be an optoelectronic device, the different portions of which include different semiconductor chips. This can, for example, be a device with LED chips emitting light in different colors, arranged in different portions. It is also possible that one of the portions has a radiation emitting semiconductor chip, such as a LED chip or a laser diode chip, and at least one other portion has a radiation detecting semiconductor chip, such as a photo diode. In this way, the device can be a device provided for distance measurement. The device can, for example, be insertable into a frame of a gesture control.

According to at least one embodiment of the device, the base area of at least two of the portions is different from each other by at least 10%. This means that the device, for example, can have a larger and at least one smaller portion in terms of area. Because of the different dimensions of the portions, the thermal strains at the two sides of the frame part separating the larger from the smaller portion, can be different in magnitude. In this case, the protective metal layer also has proven to be particularly advantageous, because it can compensate for the different mechanical strains without cracking—in contrast to a varnish layer.

According to at least one embodiment, each portion is limited in the lateral direction by the frame. This means that the frame completely surrounds each portion, such that each portion is assigned a cavity being limited at its lower side and its side surfaces by the connection carrier and the frame.

According to at least one embodiment of the device, the adhesive is directly adjacent to the regions of the metal layer, the base body and the frame. In this way, the adhesive can convey a mechanical connection between the connection carrier and the frame particularly well.

According to at least one embodiment, the metal layer has an opening offset to the semiconductor chip, which opening at least in some places is filled with adhesive. In this way, trapped air in the adhesive can be avoided, that would lead to a disconnection of the connection between the connection carrier and the frame. By means of the opening, it is secured that redundant adhesive and air can escape. Here, the opening is arranged offset to the semiconductor chips, such that electromagnetic radiation cannot go from one semiconductor chip of the device to another semiconductor chip of the device through the opening and the adhesive in the opening.

Several, namely at least two, openings can be arranged in the different regions of the metal layer, spatially offset to each other, such that a leakage path for the electromagnetic radiation is impossible also because of this.

Various further embodiments provide a connection carrier. The connection carrier can in particular be used within a device disclosed herein. This means that all features disclosed in conjunction with the device are also disclosed for the connection carrier and vice versa.

According to at least one embodiment of the connection carrier, the connection carrier comprises a base body being formed by an electrically isolating material. The connection carrier can, for example, be a FR4 circuit board, wherein the base body is formed by a filled epoxy material.

According to at least one embodiment of the connection carrier, the connection carrier comprises at least one contact being attached to the upper side of the base body. The contact is, for example, designed as a metal layer and can be provided in order for a semiconductor chip to be electrically connected, and optionally to be mechanically connected, at the contact. In particular, the connection carrier comprises at least two contacts, such that a semiconductor chip can be electrically connected via the contacts.

According to at least one embodiment, the connection carrier comprises at least one metal layer that is attached to the upper side of the base body, wherein the metal layer is not provided for electrical contacting and/or current supply. This means that, in contrast to the contacts, the metal layer is, for example, placed at the connection carrier in such a way that an electrical connection of the metal layer is not possible, or that the metal layer is not in an electrically conductive connection with any other component of the connection carrier that would make it possible to electrically connect the metal layer in operation. For example, the connection carrier has contact points for outer contacting of the connection carrier that are connected to the contacts of the connection carrier by circuit paths. The metal layer is in that case not in an electrically conductive connection with the contact points.

According to at least one embodiment, a connection carrier is specified, with—a base body that is formed by an electrically isolating material,—at least one contact that is attached to an upper side of the base body, and—at least one metal layer that is attached to the upper side of the base body, wherein the metal layer is not provided for electrical contacting and/or current supply.

For the connection carrier, it is in particular possible that the contacts and the metal layer are formed by the same material, namely the same metal or the same metal compound. It is further possible that the contacts and the metal layer are attached to the base body of the connection carrier during the same production step, for example, by evaporating. It is also possible that the contacts and the metal layer have different thicknesses. In particular, the metal layer can be designed thicker than the contacts.

According to at least one embodiment of the connection carrier, an electrically isolating covering layer covers the base body at the upper side of the base body, wherein each of the at least one contacts in some places is free from the covering layer, and the metal layer at regions of its outer surface that are not covered by the base body is completely covered by the covering layer. In other words, the electrically isolating covering layer can ensure that the metal layer cannot be electrically connected. The electrically isolating covering layer can in that case, for example, be a varnish layer, particularly a braze stop varnish layer.

BRIEF DESCRIPTION OF THE DRAWINGS

The device disclosed herein and the connection carrier disclosed herein are explained below in more detail with reference to design examples and the accompanying figures.

Figure 1:
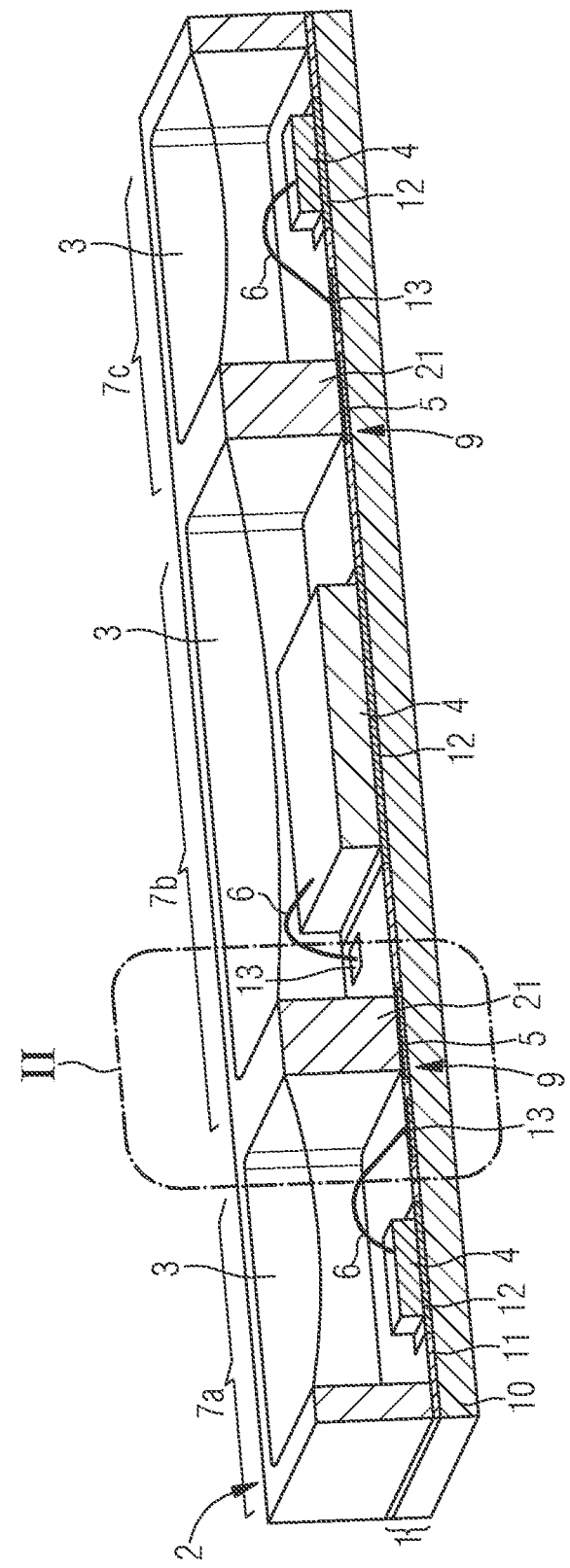
FIG. 1 shows a schematical perspective view of a design example of a device.

Same, similar or identically acting elements are provided with the same reference numerals in the figures. The figures and the proportions of the elements illustrated in the figures in relation to each other should not be considered to be true to scale. Rather, individual elements may be shown in an exaggeratedly large manner for better illustration and/or for better understanding.

The device illustrated in the figures comprises a connection carrier 1 according to a design example of a connection carrier disclosed herein.

DETAILED DESCRIPTION OF ILLUSTRATIVE EMBODIMENTS

FIG. 1 shows a schematical perspective view of a design example of a device disclosed herein. In this respect, a view through the device along a main plane of extension of the device is illustrated.

The device comprises a design example of a connection carrier 1 disclosed herein. The connection carrier 1 comprises a base body 10. The base body 10 is formed by an electrically isolating material. The electrically isolating material is, for example, a filled epoxy material. Alternatively, it is possible that the electrically isolating material is a ceramic material. The connection carrier 1 further comprises contacts 12, 13 that are provided for the electrical connection of electrical components of the device, such as semiconductor chips 4. A semiconductor chip 4 can, for example, be arranged on one of the contacts 12 and can be connected to another contact 13 of the connection carrier 1 by a contact wire 6.

The connection carrier 1 comprises another electrically isolating covering layer 11, which is, for example, a braze stop varnish layer. The electrically isolating covering layer 11 can completely cover an exposed upper side of the base body 10, wherein also parts of the contacts 12, 13 can be covered by the electrically isolating covering layer 11.

The connection carrier 1 further comprises a metal layer 5. The metal layer 5 is not provided for electrical connection of another component of the connection carrier 1 or the complete device. The metal layer 5 is, for example, formed by the same material as the contacts 12, 13 of the connection carrier. The contacts 12, 13 and the metal layer 5 contain, for example, copper or consist of copper.

Furthermore, the device comprises a frame 2 that ends, for example, flush with the outer side surfaces of the connection carrier 1. The frame 2 projects beyond the connection carrier at its upper side in a vertical direction that is perpendicular to lateral directions that run in parallel to the main plane of extension of the connection carrier 1.

In FIG. 1, a crack 9 is indicated in the base body 10 of the connection carrier 1 that might occur if the protective metal layer 5 is not provided. In particular, in case of thermal pressure, a mechanical strain occurs that can cause the crack 9, because of a separation between the encapsulation body 3 and the frame 2. This means that a damage arising in the composite of the frame 2 and encapsulation body 3, without the metal layer 5, can continue into the connection carrier 1 and from there on in particular into the base body 10 causing the device to break in this place.

In the present case, the device has portions 7a, 7b, 7c which respectively are completely surrounded by the frame 2 in the lateral directions. In this case, the frame parts 21 separate adjacent portions 7a, 7b, 7c from each other. The metal layer 5 is, at least in the region of the frame parts 21, arranged between the base body 10 of the connection carrier 1 and the frame 21. If mechanical strains now occur during warming or cooling of the device because of the different thermal expansion coefficients between the frame 2, the connection carrier 1 and the encapsulation body 3, the metal layer 5 prevents a spreading of cracks 9 into the connection carrier 1. In this way, the device disclosed herein is particularly mechanically stable. The metal layer 5, for example, has a thickness of 30 µm and can be designed thicker than the contacts 12, 13. Because of the small thickness of the metal layer 5, the total thickness of the device is barely increased.

In the portions 7a, 7b, 7c the cavities limited by the frame 2 are respectively filled with an encapsulation body 3. If the semiconductor chips 4, for example, are optoelectronic semiconductor chips, the encapsulation bodies 3 are designed at least radiation permeable or even transparent.

In contrast to what is indicated in FIG. 1, it is also possible that the metal layer 5 is arranged along the whole frame between the frame 2 and the connection carrier 1. The metal layer 5 runs then, not only in some portions, but completely along the frame 2 between the frame 2 and the connection carrier 1.

Figure 2:
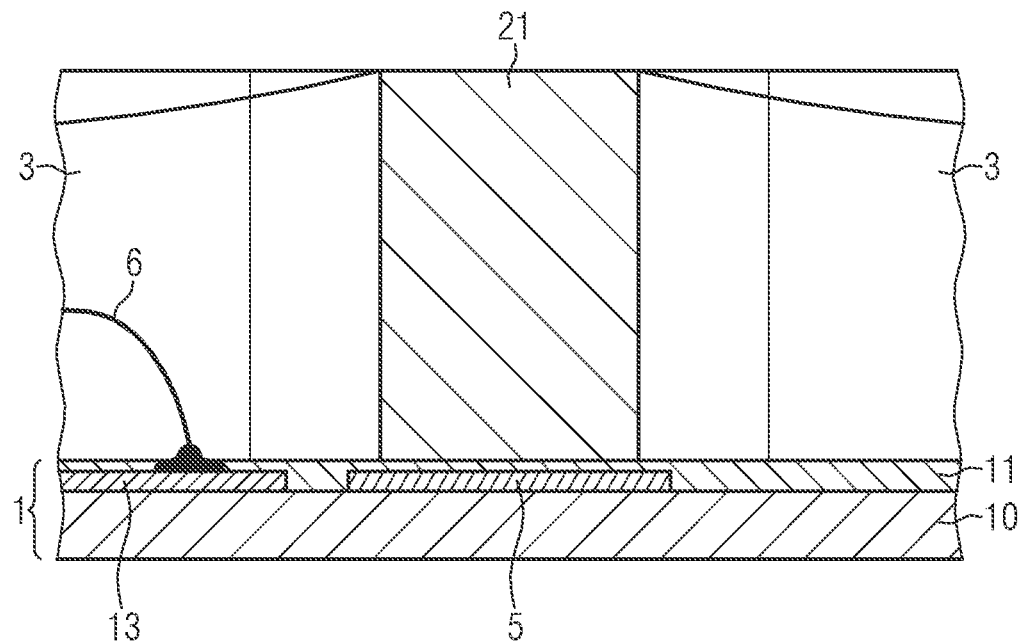
FIGS. 2 and 3 show schematical side views of a detail of the device illustrated in FIG. 1.
Figure 3:
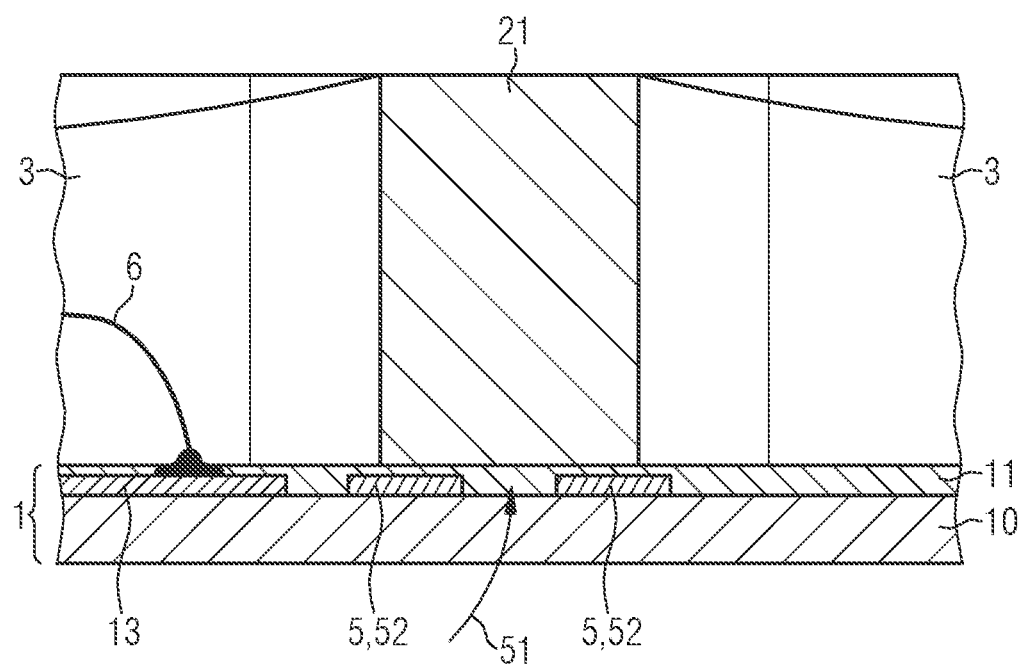

In connection to FIGS. 2 and 3, two different embodiments of the metal layer 5 are indicated.

In FIG. 2, it is illustrated that the metal layer 5 is designed as a simply interrelated metal layer with a width in a lateral direction perpendicularly to the main plane of extension of the frame that is larger than the width of the frame. The metal layer 5 therefore projects beyond the frame in the lateral direction and is in some places within the cavities that are surrounded by the frame in the portions 7a, 7b and 7c. This means that the encapsulation body 3 in some places covers the metal layer 5. Between the metal layer 5, the frame 2 and the encapsulation body 3, further materials, such as the electrically isolating covering layer 11 and/or an adhesive can be arranged. It is however also possible that the metal layer 5 and the frame 2 at least in some portions are in direct contact with each other.

In contrast to the design example from FIG. 2, the metal layer 5 in the design example from FIG. 3 has two laterally separated regions 51, 52, such that, along a center axis of the frame 2, no material of the metal layer 5 is arranged between the frame 2 and the connection carrier. In other words, the metal layer is separated into two electrically isolated regions. The metal layer is specifically only introduced where the mechanical strain during a thermal cycle stress is the largest. This is at the place where the encapsulation body 3, the frame 2 and the connection carrier 3 converge. The different thermal expansion coefficients that occur because of the different materials of the connection carrier 1, frame 2 and encapsulation body 3, have the strongest results in these places.

A disconnection of the metal layer 2 in at least two regions 51, 52 that are separated from each other, also increases the ESD strength, since no jumping of electrical charging between the different portions 7a, 7b, 7c of the device can occur.

In connection with FIGS. 1, 2 and 3, a device is disclosed having three portions 7a, 7b, 7c that are respectively separated from each other by a frame part 21. In contrast to what is illustrated in the figures, the device disclosed herein can also be a device with more or fewer portions. In particular, it is also possible that the device has exactly one portion that is completely surrounded by the frame 2 in the lateral direction. In this case, it is in particular possible that the metal layer 5 in its course follows the course of the frame completely, such that the metal layer 5 completely surrounds the semiconductor chip 4 in the form of a frame.

An example of the mode of operation of a device disclosed herein is explained in further detail with reference to FIG. 4. The device in FIG. 4 comprises a connection carrier 1 with a base body 10 on which the contacts 12, 13 for contacting of the semiconductor chips 4 are arranged.

The semiconductor chips 4 comprise, for example, a first semiconductor chip 4a designed as a sender. This first semiconductor chip 4a is, for example, formed by a LED chip emitting electromagnetic radiation 8 under operation. A second semiconductor chip 4b of the semiconductor chips 4 can be designed as a receiver which, for example, is a photo diode being designed for detection of the electromagnetic radiation 8 generated by the first semiconductor chip 4a during operation.

Figure 4:
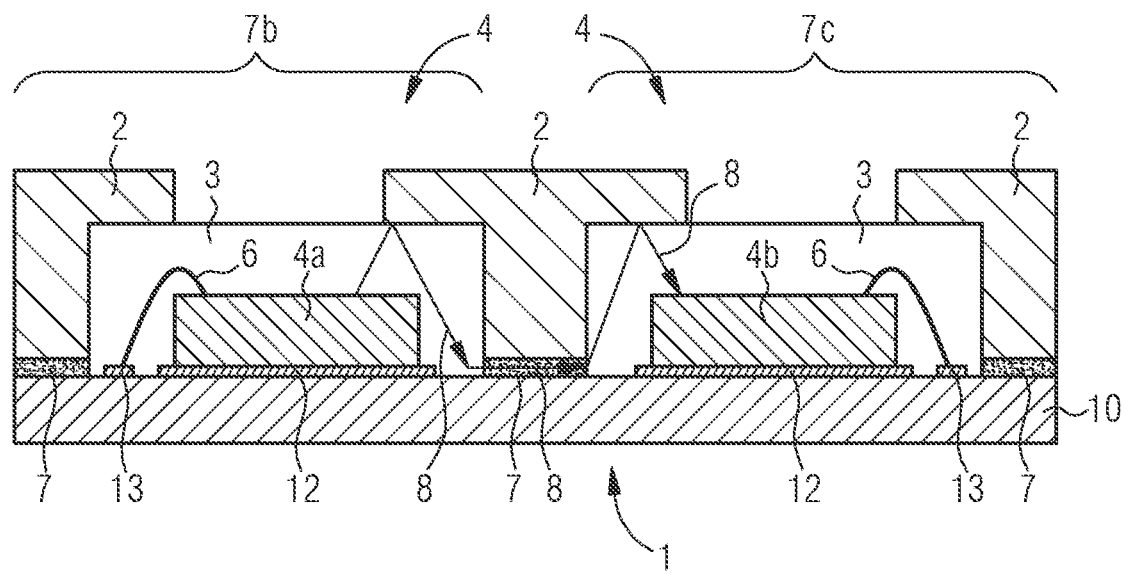
FIG. 4 shows an example of the mode of operation of a device.

In the device in FIG. 4, the frame 2 is attached to the connection carrier by means of an adhesive 7. The adhesive 7 is, for example, directly adjacent to the base body 10 and the frame 2. As it can be seen in FIG. 4, cross talking of electromagnetic radiation 8 from one portion 7b of the device with the first semiconductor chip 4a into another portion 7c of the device with the second semiconductor chip 4b through the adhesive 7 is possible. In this way, a background noise occurs in the detected signal of the second semiconductor chip 4b, that is disturbing to the evaluation of the signal.

Figure 5:
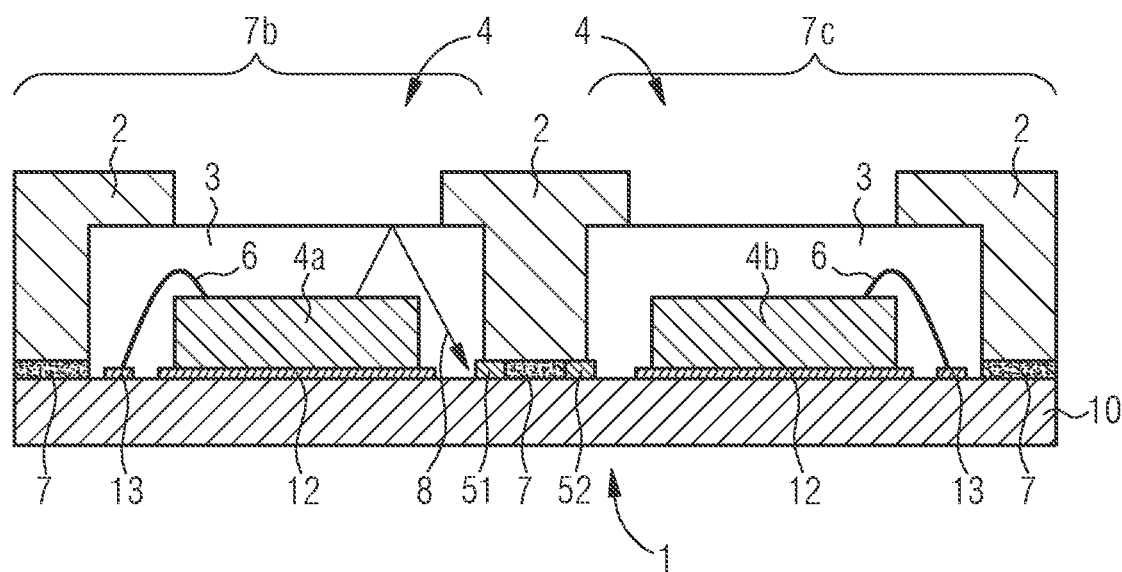
FIGS. 5 to 7 show schematical views of design examples of devices.

In contrast to FIG. 4, FIG. 5 shows a design example of a device disclosed herein, wherein the laterally separated regions 51, 52 of the metal layer 5 run at the edge of the frame 2 along a center axis of the frame. The adhesive 7 is arranged between the regions 51, 52, in this way being shielded against the electromagnetic radiation 8 and preventing cross talking of the electromagnetic radiation 8 between the portions 7b, 7c.

Figure 6:
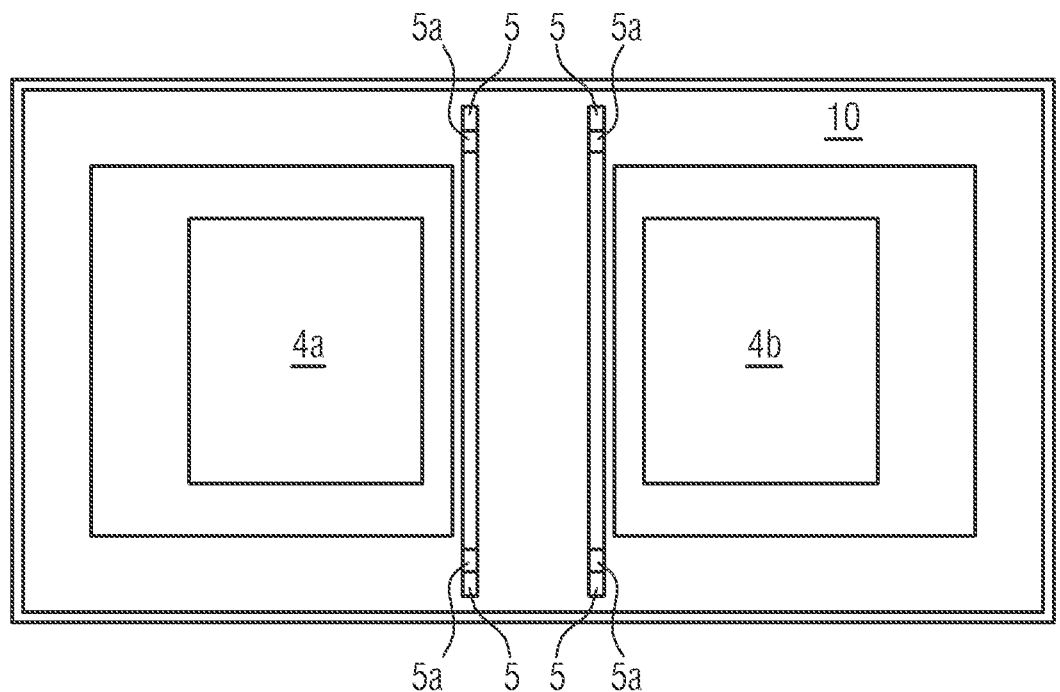

FIG. 6 shows a top view of a design example of such a device. Here, the regions 51, 52 of the metal layer are exclusively provided along the frame part 21, thus separating the adjacent portions from each other. Openings 5a can be provided in the metal layer offset to the semiconductor chips 4a, 4b and being filled with adhesive 7 in some places. These openings 5a serve to prevent trapping of air in the adhesive 7 which would reduce an adhesive surface between the adhesive and the frame on one hand and the adhesive 7 and the connection carrier 1 on the other hand.

Figure 7:
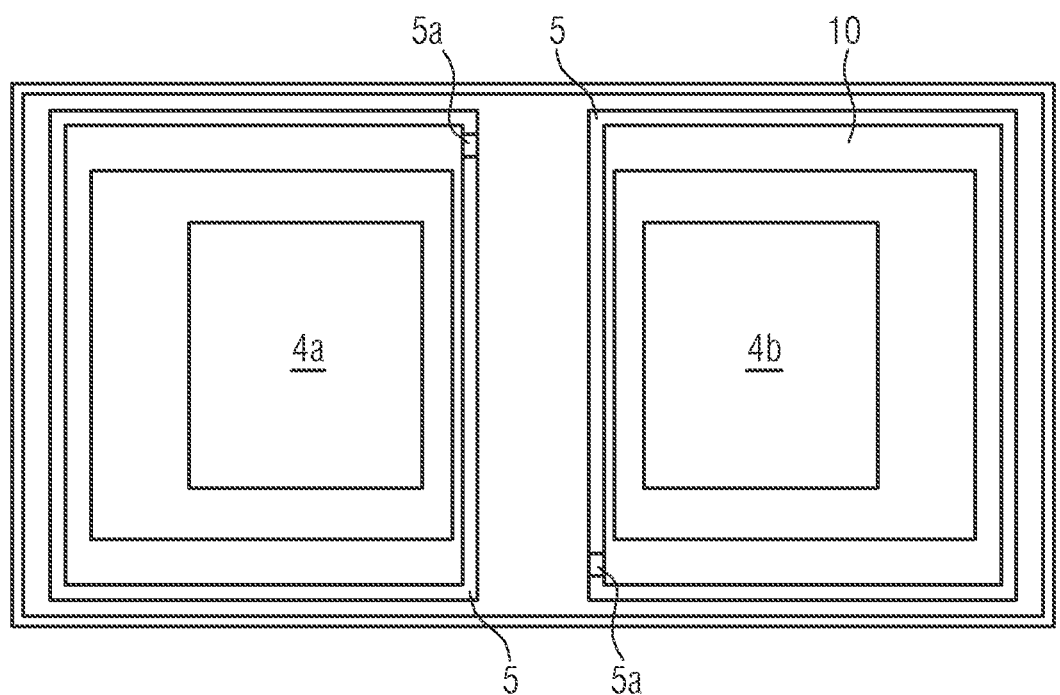

The top view in FIG. 7 shows that the metal layer 5 can be designed circumferentially. In that case, it can also be used as a spacer. Furthermore, in FIG. 7 it is illustrated that the openings 5a not only can be designed offset to the semiconductor chips 4a, 4b, but also offset to each other. In this way, a leakage path for electromagnetic radiation is prevented in an effective way.

The invention is not limited to the design examples by the description based thereon. Rather, the invention encompasses any novel feature as well as any combination of features, including in particular any combination of features in the claims, even if this feature or combination itself is not explicitly specified in the claims or design examples.

The invention claimed is:

1. A device comprising:
   a connection carrier, a frame and an encapsulation body, wherein the connection carrier, the encapsulation body and/or the frame have different thermal expansion coefficients;
   a semiconductor chip mechanically and electronically connected to the connection carrier; and
   a metal layer arranged between the connection carrier and the frame,
   wherein the encapsulation body surrounds the semiconductor chip and is adjacent to the connection carrier and the frame,
   wherein the metal layer is not in electrically conductive connection,
   wherein the metal layer projects beyond the frame in a lateral direction,
   wherein the device comprises at least two portions, wherein the portions are separated from each other by frame parts of the frame, and wherein each portion comprises at least one semiconductor chip.

2. The device according to claim 1, wherein the metal layer is covered by the encapsulation body in some places.

3. The device according to claim 1, wherein the metal layer has at least two laterally separated regions.

4. The device according to claim 1, wherein a course of the metal layer in a plane parallel to a main plane of extension of the connection carrier in portions or completely follows a course of the frame in a plane parallel to the main plane of extension of the connection carrier.

5. The device according to claim 1, wherein the metal layer at its exposed outer surface is covered by an electrically isolating covering layer.

6. The device according to claim 5, wherein the covering layer in some places covers a base body and contacts of the connection carrier.

7. The device according to claim 1, wherein the metal layer has a thickness between at least 8 µm and at most 50 µm.

8. The device according to claim 1, wherein base areas of the at least two portions are different from each other by at least 10%.

9. The device according to claim 1, wherein each portion is limited in lateral directions by the frame.

10. The device according to claim 1,
    wherein the metal layer has at least two laterally separated regions,
    wherein an adhesive is arranged between the regions, and
    wherein the adhesive mechanically connects a base body of the connection carrier with the frame.

11. The device according to claim 10, wherein the adhesive is directly adjacent to the regions of the metal layer, the base body and the frame.

12. The device according to claim 1, wherein the metal layer has an opening offset to the semiconductor chip, and wherein opening at least in some parts is filled with an adhesive.

13. A device comprising:
    a connection carrier, a frame and an encapsulation body, wherein the connection carrier, the encapsulation body and/or the frame have different thermal expansion coefficients;
    a semiconductor chip mechanically and electronically connected to the connection carrier; and
    a metal layer arranged between the connection carrier and the frame,
    wherein the encapsulation body surrounds the semiconductor chip and is adjacent to the connection carrier and the frame,
    wherein the metal layer is not in electrically conductive connection,
    the metal layer projects beyond the frame in a lateral direction,
    wherein the metal layer has at least two laterally separated regions,
    wherein the device comprises at least two portions, wherein the portions are separated from each other by frame parts of the frame, and wherein each portion comprises at least one semiconductor chip.

14. The device according to claim 13, wherein base areas of the at least two portions are different from each other by at least 10%.

15. The device according to claim 13, wherein each portion is limited in lateral directions by the frame.

16. A device comprising:
    a connection carrier, a frame and an encapsulation body, wherein the connection carrier, the encapsulation body and/or the frame have different thermal expansion coefficients;
    a semiconductor chip mechanically and electronically connected to the connection carrier; and
    a metal layer arranged between the connection carrier and the frame,
    wherein the encapsulation body surrounds the semiconductor chip and is adjacent to the connection carrier and the frame,
    wherein the metal layer is not in electrically conductive connection,
    wherein the metal layer projects beyond the frame in a lateral direction, wherein the metal layer has at least two laterally separated regions, wherein an adhesive is arranged between the regions, and wherein the adhesive mechanically connects a base body of the connection carrier with the frame.

17. The device according to claim 16, wherein the adhesive is directly adjacent to the regions of the metal layer, the base body and the frame.

18. The device according to claim 16, wherein a course of the metal layer in a plane parallel to a main plane of extension of the connection carrier in portions or completely follows a course of the frame in a plane parallel to the main plane of extension of the connection carrier.

19. The device according to claim 16, wherein the metal layer at its exposed outer surface is covered by an electrically isolating covering layer.

20. The device according to claim 19, wherein the covering layer in some places covers the base body and contacts of the connection carrier.

* * * * *